Figure 1:
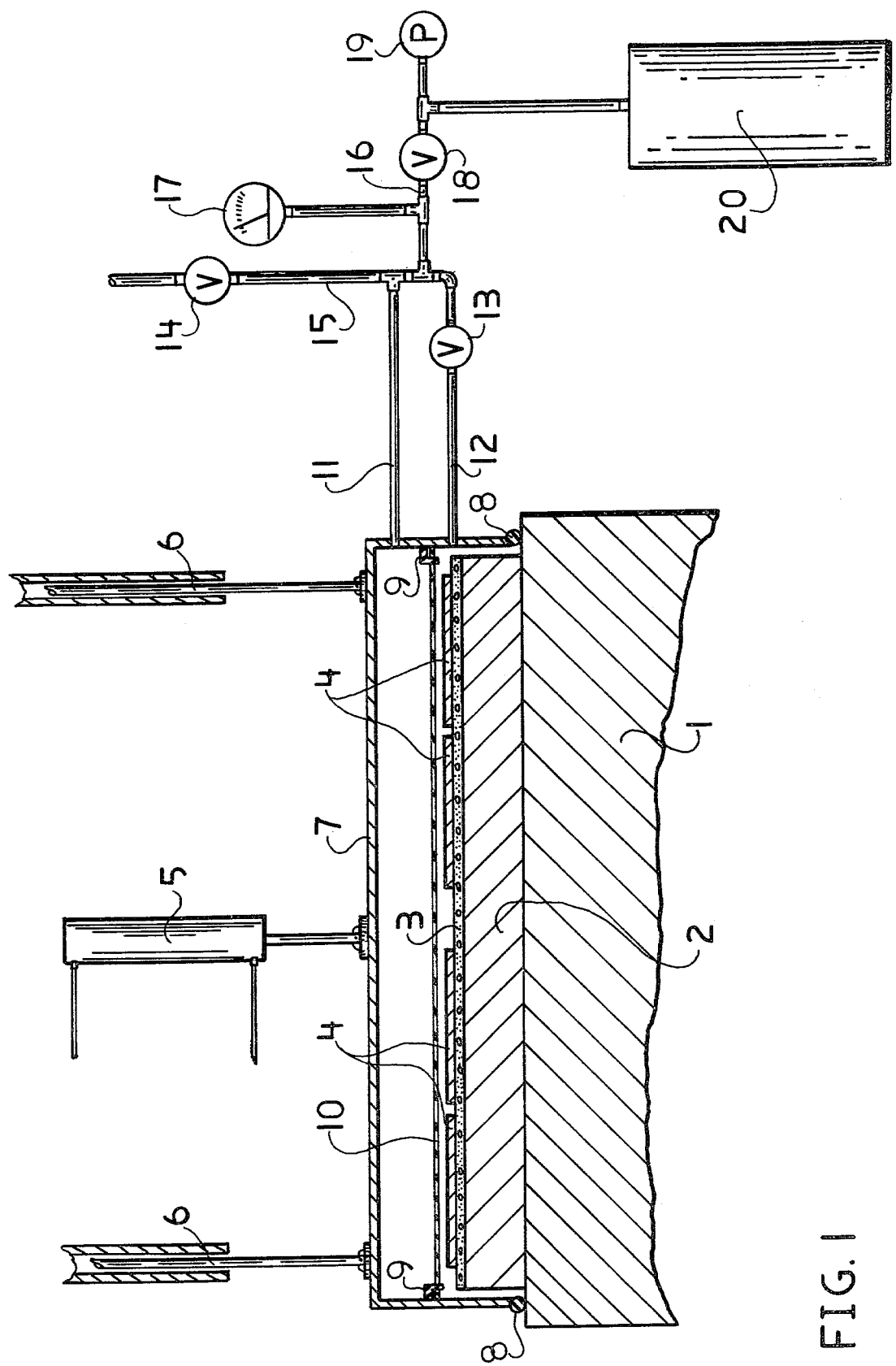

United States Patent [19]

Regler et al.

[11] 4,283,242
[45] Aug. 11, 1981

[54] PROCESS FOR CEMENTING SEMICONDUCTOR DISCS ONTO A CARRIER PLATE

[75] Inventors: Dieter Regler; Bruno Meissner; Alfred Moritz, all of Burghausen, Fed. Rep. of Germany

[73] Assignee: Wacker-Chemitronic Gesellschaft für Elektronik-Grundstoffe mbH, Burghausen, Fed. Rep. of Germany

[21] Appl. No.: 73,415

[22] Filed: Sep. 7, 1979

Related U.S. Application Data

[63] Continuation of Ser. No. 884,459, Mar. 8, 1978, abandoned.

[30] Foreign Application Priority Data

Mar. 22, 1977 [DE] Fed. Rep. of Germany ....... 2712521

[51] Int. Cl.³ .............................................. B32B 31/22
[52] U.S. Cl. .................................... 156/154; 156/286; 156/344; 156/345; 156/382; 156/636
[58] Field of Search ................ 156/285, 286, 382, 636, 156/345, 154, 544; 51/281

[56] References Cited

U.S. PATENT DOCUMENTS

| 3,322,598 | 5/1967 | Marks et al. | 156/382 |
| 3,405,019 | 10/1968 | Seil et al. | 156/382 |
| 3,453,166 | 7/1969 | Herriott et al. | 156/286 |
| 3,475,867 | 11/1969 | Walsh | 51/281 |
| 3,493,451 | 2/1970 | Beery | 156/382 |
| 3,554,834 | 1/1971 | Bennett et al. | 156/286 |
| 3,681,171 | 8/1972 | Hojo et al. | 156/382 |
| 4,104,099 | 8/1978 | Scherrer | 156/154 |

FOREIGN PATENT DOCUMENTS

316134 11/1939 United Kingdom ..................... 156/286

Primary Examiner—Jerome W. Massie
Attorney, Agent, or Firm—Allison C. Collard; Thomas M. Calgano

[57] ABSTRACT

An apparatus and process for cementing semiconductor discs onto a carrier plate, wherein after the carrier plate is coated with a layer of adhesive substance, the discs are applied to the adhesive layer and a vacuum-tight sealing dome is placed over the carrier plate to define a sealed, hollow space. A chemically-inert elastic diaphragm is clamped within the dome 0.2 to 1.5 mm above the free surface of the discs, to divide the hollow space into two sections or subchambers which are initially simulataneously evacuated. Then, air pressure is applied to the upper section, so that the discs are pressed by the diaphragm onto the cement layer. Air pressure is then subsequently fed to the lower hollow space, so that the dome can be removed from the carrier plate.

3 Claims, 1 Drawing Figure

PROCESS FOR CEMENTING SEMICONDUCTOR DISCS ONTO A CARRIER PLATE

This is a continuation of application Ser. No. 884,459, filed Mar. 8, 1978, now abandoned.

The present invention relates to a process for cementing on discs, in which the discs are placed onto and pressed against a carrier-plate coated with a cement substance.

When semiconductor discs are polished, the individual discs must be held in a fixed position on the support during polishing. Even if only one disc becomes detached, its broken fragments will result in the destruction of the entire batch, and of the polishing cloth. The discs are only securely anchored in the cement substance when they are pressed uniformly onto the cement layer during cementing on. When discs are cemented on using a rigid press, however, due to the fact that their thicknesses are not alike, some discs are pressed on too strongly, some are pressed on too lightly, and some discs are not pressed on at all.

There is a second problem wherein the discs, which are usually placed onto the cement layer with suction tweezers, can cause an occlusion of air under the discs, to produce stresses in the discs when the discs are subsequently rigidly pressed against the cement layer and the layer has set. When the discs are removed after polishing, they spring back into their original state, thus forming a wavy surface. Wavy semiconductor discs, especially when using photolithographic processes, result in lack of definition in the exposure of the photosensitive resist applied to the surface of the disc. It is therefore not possible to produce from wavy discs, components having a high circuit packing density.

The problem underlying the invention was therefore to find a cementing-on process in which even discs of different thicknesses could be reliably pressed into the cement layer, without the occlusion of air bubbles.

This problem was solved in accordance with the present invention, wherein the carrier plate, coated with a suitable cement substance is, after applying the discs, covered with a vacuum-tight sealing dome. The dome, together with the carrier plate, define a hollow space in which an elastic, air-impermeable, chemically-inert diagragm is clamped horizontally towards the discs. When the dome is closed, the diaphragm lies approximately 0.2 to 1.5 mm above the free surface of the discs. The hollow space, divided into two by the diaphragm, is evacuated to a pressure of 10 to $10^{-5}$ torr. Subsequently, the discs are pressed by the diaphragm into the cement layer by feeding air to the portion of the hollow space formed between the diaphragm and the upper wall of the dome. After subsequently feeding air to the lower portion of the hollow space between the cement layer and the diaphragm, the dome is removed from the carrier plate.

The instant invention is explained in more detail with reference to the drawing. The drawing schematically shows an apparatus that is especially suitable for carrying out the instant process.

Referring to the drawing, the still warm carrier plate 2, consisting of, for example, stainless steel or coated or uncoated aluminum, onto which the cement layer 3 has been whirler-coated, is placed on a work table 1 consisting of, for example, aluminum, steel, marble or sinter brick. Carrier plate 2 and cement layer 3, which has been whirler-coated on, at this stage have a temperature of, usually, about 50° to 160° C., preferably, approximately 90° to 110° C.

It is possible to use as cement substances, paraffin, pizein, wax/colophony mixtures or, preferably, additive-modified coumarone/indene resins, phenol resins, polyterpene resins, pentaerythritol resin esters or glycerol esters of dehydrogenated colophony, and maleic resins, as described in German Offenlegungsschrift No. 2,608,427.

Semiconductor discs 4 are placed onto the cement layer, which is usually approximately 15 to 30 $\mu$m thick, and is still soft, using conventional suction tweezers. A dome 7 is provided over carrier plate 2, which can be moved vertically in appropriate guides 6, for example, by means of a pneumatic lifting cylinder 5. Dome 7 consists, for example, of aluminum or plastic material, such as, for example, polyvinyl chloride, and is disposed over carrier plate 2 at the outer edge thereof, as shown in the drawing. A gasket 8 consisting, for example, of silicon rubber or rubber, is secured to the outer edge of the dome, to provide a vacuum-tight seal for the space inside the dome.

An elastic, air-impermeable diaphragm 10, which is chemically inert towards the discs to be cemented on and consists, for example, of silicone-treated or rubberized synthetic fabric, is fitted by vulcanization into a two-part ring 9 in the interior of dome 7. The upper part of the ring is securely joined to the dome wall. Retaining ring 9 clamping the diaphragm is arranged in the dome so that when the dome is closed, the diaphragm lies approximately 0.2 to 1.5 mm above the free surface of the discs. Above and below the diaphragm, are pipe lines 11 and 12, leading into the interior of the dome. It is possible for pipe line 12 to be closed by a valve 13. There is furthermore arranged on pipe line 11, an air supply connection 15, closable by means of a valve 14. Pipe lines 11 and 12 lead into a common tube 16, the interval pressure of which can be read off at manometer 17. By means of a valve 18, pipe 16 is connected to a vacuum pump 19 and advantageously, a vacuum-ballast vessel 20, which can be evacuated by means of vacuum pump 19.

The pressing of the discs onto the still soft cement layer 3 on carrier plate 2 is performed by evacuating the entire inner space, after closing dome 7, to a pressure of approximately 10 to $10^{-5}$ torr, usually 1 to 5 times $10^{-1}$ torr, by valve 18 being opened while vacuum pump 19 is running with valve 13 open and valve 14 closed. Vacuum-ballast vessel 20 is advantageously approximately 10 to 30 times as large as the hollow space defined by dome 7 and carrier plate 2. Vacuum-ballast vessel 20 is not absolutely necessary, but by using it, it is possible to accelerate enormously the evacuation of the interior of the dome. Vacuum-ballast vessel 20 is advantageously already pumped free of air by vacuum pump 19 before or while discs 4 are placed onto cement layer 3.

After the hollow space defined by carrier plate 2 and dome 7, has been evacuated to a desired residual pressure of preferably approximately 1 to $5 \times 10^{-1}$ torr, the three-way valve 18 and valve 13 are closed, and the upper part of the hollow space between dome and carrier plate, which is divided in two by diaphragm 10, is supplied with air by opening valve 14. Under the action of the external air pressure, diaphragm 11 presses discs 4 uniformly into cement layer 3. Subsequently, valve 13 is also opened and dome 7 is lifted from carrier plate 2, by means of pneumatic lifting cylinder 5. Once the cement has set, discs 4 are reliably fixed on carrier plate 2. Carrier plate 2, with the cemented-on semiconductor discs 4 can then be used in the polishing machine.

The cementing-on process, according to the instant invention, is obviously not limited to cementing on semiconductor discs of, for example, silicon, germanium, gallium arsenide or gallium phosphide, but can equally be used for polishing or lapping sapphire or ruby substrate discs or, for example, optical lenses.

EXAMPLE 12 silicon discs having a diameter of 75 mm and a thickness of 380±10 μm, were placed on a round carrier plate of aluminum having a diameter of 495 mm, after this had been whirler-coated with a 20 μm thick layer of cement, consisting of a mixture of wax and colophony. Then, an aluminum dome having an internal diameter of 505 mm, which had a gasket consisting of silicone rubber at its bearing edge, was placed over the edge of the carrier plate onto the table surface. When the dome was closed, the diaphragm, consisting of a fabric-reinforced, 1.5 mm thick, air-tight rubber fabric having a knopped underside, fitted by vulcanization into the two-piece retaining ring, was disposed approximately 1 mm above the surface of the semiconductor discs, whereas the distance between the diaphragm and the upper wall of the dome was approximately 5 mm. Subsequently, the space sealed by the dome was evacuated on both sides of the diaphragm to a pressure of approximately 0.5 torr, the vacuum-ballast vessel connected in a series upstream of the oil pump having a volume of 0.02 m$^3$. By feeding air to the hollow space above the diaphragm, under the action of the external air pressure, the diaphragm was pressed onto the semiconductor discs and these were thus pressed firmly into the soft cement layer having a temperature of approximately 90° C. Then the space beneath the diaphragm was also supplied with air and the dome was removed again. After the cement had hardened and the remainder of the cement between the individual semiconductor discs was removed, the carrier plate was inserted into a polishing machine. During the polishing operation, none of the silicon discs came loose from the underside. The polished discs were absolutely wave-free when removed.

While only a single embodiment is shown and disclosed, it is obvious that many changes and modifications may be made thereunto, without departing from the spirit and scope of the invention.

What is claimed is:

1. A process for cementing semiconductor wafers temporarily onto a carrier plate of a polishing machine so as to permit semiconductor wafers of relatively different thicknesses to be reliably pressed into a cement layer without the occlusion of air bubbles, and such that the upper surfaces of said wafers extend above the cement layer and lie substantially in the same plane, comprising the steps of:

coating the carrier plate totally with an even layer of cement substance;

applying the wafers to the cement substance on the carrier plate;

placing a vacuum-tight sealing dome over the carrier plate, so as to define a sealed hollow space;

clamping an elastic, chemically-inert diaphragm within said dome 0.2 to 1.5 mm above the free surface of the wafers, said diaphragm dividing the hollow space into two subchambers;

simultaneously evacuating the entire hollow space defined by said two subchambers to a pressure of 10 to $10^{-5}$ torr;

subsequently applying air pressure in the subchamber between the diaphragm and the top of the dome by venting said space to an outside air source, so that the wafers are pressed by the diaphragm onto the cement layer;

thereafter feeding air pressure to the subchamber between the cement layer and the diaphragm, and, removing the dome from the carrier plate;

allowing said cement layer to set;

polishing said wafers in a polishing machine; and removing absolutely wave-free wafers from said polishing machine.

2. The process as recited in claim 1, wherein said step of placing the dome over the carrier plate comprises lowering the dome by means of a pneumatic lifting cylinder and vertical guides onto the carrier plate.

3. The process as recited in claim 1, wherein said step of evacuating the hollow space, comprises opening a valve to connect an evacuated ballast vessel to said hollow chamber.

* * * * *